(12) United States Patent
Wang et al.

(10) Patent No.: US 8,796,722 B2
(45) Date of Patent: Aug. 5, 2014

(54) LIGHT-EMITTING MATERIAL OF NITROGEN COMPOUND, PREPARATION PROCESS THEREOF AND ILLUMINATION SOURCE MANUFACTURED THEREFROM

(75) Inventors: Haisong Wang, Beijing (CN); Peng Bao, Beijing (CN)

(73) Assignee: Beijing Yuji Science and Technology Co. Ltd, Beijing (CN)

( * ) Notice: Subject to any disclaimer, the term of this patent is extended or adjusted under 35 U.S.C. 154(b) by 0 days.

(21) Appl. No.: 13/882,475

(22) PCT Filed: Sep. 29, 2011

(86) PCT No.: PCT/CN2011/080391
§ 371 (c)(1),
(2), (4) Date: Apr. 29, 2013

(87) PCT Pub. No.: WO2013/044490
PCT Pub. Date: Apr. 4, 2013

(65) Prior Publication Data
US 2013/0214314 A1  Aug. 22, 2013

(51) Int. Cl.
*H01L 33/00* (2010.01)
*C09K 11/77* (2006.01)
*H01L 33/26* (2010.01)

(52) U.S. Cl.
CPC ........... *C09K 11/7731* (2013.01); *Y02B 20/181* (2013.01); *H01L 33/26* (2013.01)
USPC ....................... 257/98; 257/103; 252/301.4 F

(58) Field of Classification Search
CPC .......................... H01L 33/26; C09K 11/7731
USPC ............................... 257/98, 103; 252/301.4 F
See application file for complete search history.

(56) References Cited

U.S. PATENT DOCUMENTS 7,282,849 B2 * 10/2007 Ohto et al. .................... 313/486

FOREIGN PATENT DOCUMENTS

| CN | 1499651 A | 5/2004 |
|---|---|---|
| CN | 1547264 A | 11/2004 |
| CN | 1595670 A | 3/2005 |
| CN | 10119574 A | 6/2008 |

* cited by examiner

*Primary Examiner* — Tu-Tu Ho
(74) *Attorney, Agent, or Firm* — Maschoff Brennan

(57) ABSTRACT

A nitrogen compound luminescent material belongs to the field of LED inorganic luminescent materials. The nitrogen compound luminescent material has a chemical formula: $M_{1-y}Eu_yAlSiC_xN_{3-4/3x}$. In the formula, M represents one or several of Li, Mg, Ca, Sr and Ba; $0<x\leq0.2$, $0<y\leq0.5$; and C represents the element Carbon. The luminescent material can be excited by ultraviolet, near ultraviolet or blue excitation light source such as LED, and emits red light with wavelength between 500-800nm, especially the maximum emission wavelength between 600-700 nm, exhibiting a wider excitation spectrum range, efficiency and stability. The corresponding method of the preparation is simple, easy to mass production and pollution-free. By using the luminescence material, and with ultraviolet, near ultraviolet or blue LED and other luminescent materials such as green fluorescent powder, a white LED light source can be provided.

20 Claims, 4 Drawing Sheets

Appendix of Graphs

Appendix of Graphs

LIGHT-EMITTING MATERIAL OF NITROGEN COMPOUND, PREPARATION PROCESS THEREOF AND ILLUMINATION SOURCE MANUFACTURED THEREFROM

THE TECHNICAL FIELD BELONGS

The present invention relates to the field of semi-conductor, particularly to a kind of Nitrogen compounds as well as the preparation method and illuminating source by using it.

TECHNICAL BACKGROUND

GaN based Light-Emitting Diode as 21 st century's new-type light-emitting devices for solid state lighting shows a series of advantages just as following: small, electricity-saving, with long service life, free of the polluted-environment Hydrargyrum, efficient and low maintenance and with which GaN based Light-Emitting Diode can be widely used in a variety of lighting facility which including interior illumination, traffic lights, automobile tail light/headlamp, outdoor large screen, display and advertising screen. The trend that replacing currently used all kinds of light bulbs and fluorescent lamps had already emerged. And the new type of green lighting source will have become the new generation of illuminating system, which will have introduced a profound effect on energy-conserving, environment-protection and the improvement of life quality. The fabrication techniques of White LED are as following: the three-monochrome blue-green-and-red LED combination, blue LED mixed with yellow fluorescent powder, ultraviolet LED mixed with red -green-and-blue fluorescent powder. However, there is little inorganic luminescent material which can be excited by blue LED. The mostly used fluorescent materials Yttrium Aluminitum Garnet (YAG) and Ce so far combined with blue LED on basis of the principle of complementary color, white light reached. However, the photochromism of the light provided by YAG closes to yellow-green, high-color-temperature cool coloured white light can only be reached with color rendering index low. Then, red fluorescent powder should be considered for different color-temperature white light ranged from cool colors to warm colors, and also for better color rendering index.

The currently used green fluorescent powder, which can be excited by blue light (420-480 nm), blended mostly with divalent Europium Sulfide, such as (Ca, Sr, Ba)S: $Eu^{2+}$. However, with poor chemical resistance and thermal stability, Sulfide fluorescent powder is phone to react with the moisture from the air, the heat after decomposition, and with some exhaust fumes released in manufacture procedure which polluted the air. Recently, the using nitrogen compounds, which composed by $SiN_4$ as the basic unit, as the host material for the fluorescent powder received great attention. On the basis of the strong covalent bond and the large crystal field splitting, when mixed with lanthanon such as divalent Europium, these compounds can excite luminescence under the longer wavelengths, such $M_2Si_5N_8$: $Eu^{2+}$ (M=Sr, Ca, Ba) which can emit red light. However, even with high quantum efficiency, the nitride red fluorescent powder has high luminescence decay, which severely limits its applications.

THE CONTENTS OF THIS INVENTION

The present invention aiming at the above-mentioned areas of problems offers a Nitrogen compound luminescence material, with stable chemical properties and excellent luminescent performance, can be excited then emits red light by ultraviolet or blue light, and with excitation wavelength between 200-500 nm, emission wavelength between 500-800 nm, higher luminous intensity and better temperature characteristics.

In another aspect of this invention, the method of the preparation for the luminescence material was introduced, which is simple, handled easily, easy to mass production, pollution-free and with low costs. By using this method, high illumination-intensity, even granular and with particle size smaller than 15 nm micronized fluorescent powder can be reached.

The present invention also aimed at offering a white LED light source by using the luminescence material, with high color rendering index, high luminous efficiency, and wider color temperature range.

A type of Nitrogen compound luminescence material, with chemical formula: $M_{1-y}Eu_yAlSiC_xN_{3-4/3x}$, M in the formula is for alkali metal, $0<x\leq0.2$, $0<y\leq0.5$, C is for the element carbon.

And the alkali metal is one or several of Li, Mg, Ca, Sr and Ba.

The M must contain an element Ca.

The M is a combination of element Ca and Sr, or of element Ca and Li.

$$0.01\leq x\leq 0.1, 0\leq y\leq 0.1.$$

The preparation procedure of the above mentioned Nitrogen compound luminescent material is as following:

(1) By milling, we mixed elemental M, M-containing Oxides, Nitrides, Nitrates, Carbonates or Halide, with Eu-containing Nitrides, Nitrates, Oxides or Halide, and with Al-containing Nitrides, Oxides, Nitrates, Carbonates or Halide, and elemental Si and Si-containing Nitrides, Oxides or Nitrides, and elemental C or compound C.

(2) Under inert gas protection the mixture reached from step above through high-temperature roasting by using gas pressure sintering or solid reaction process, some roasted product reached.

(3) The roasted product was then through grinding, impurity removal, heating and sizing, and then Nitrogen compound luminescence material reached.

Electively, inert gas introduced in gas pressure sintering step is Nitrogen, with the pressure between 1-200 atmospheres.

Electively, inert gas introduced in solid reaction process is room-pressure Nitrogen, and the gas flow rate is between 0.1-3 L/min.

Electively, the temperature from high-temperature roasting step is between 1200-1900° C., and roasting for 0.5-30 hours at a time or by several times.

Electively, a reaction flux was added in step (1), which is one or several of M-containing halide, Al-containing halide and Boric acid.

Electively, additive amount of the reaction flux is 0.01-10% of the total amount of raw materials.

Electively, the impurity removal step includes acid pickling or rinsing by water.

The white LED light source characterized in blue LED-containing, green luminescence material containing and above mentioned red luminescence material containing.

The present luminescence material can be excited by ultraviolet, near ultraviolet or blue excitation light source such as LED, then emits red light with wavelength between 500-800 nm, especially the maximum emission wavelength between 600-700 nm. The present Nitrogen-compound fluorescent powder which can be excited by ultraviolet to blue light and emit red light, has enhanced the temperature characteristics and luminous intensity by mixing in the element carbon. The introduction of the element carbon as the reaction raw materials was intended to lower the oxygen content of the nitride product and improve the luminous performance through the reaction with the oxides ($MO_z$) on the surface of other raw materials at high temperature. The reaction formula is as following: $2MO_z+2zC+mN2 \rightarrow 2MN_m+2zCO$. (2) The carbon element entered into the lattice of the matrix nitride materials, which increased the crystal field splitting degree, and improved the luminous performance and the luminous intensity. And because of the decreased oxygen content of the end product, the present compound has high purity and improved luminous intensity. The chemical bonds linked element C and mixed element Eu together mainly are covalent bonds, which are similar to those between element N and element Eu. And such covalently link is conducive to the temperature characteristics of the luminescent materials.

In the process of high-temperature roasting, inert gas was introduced for the following purposes: (1) to protect some nitride material and reaction products from decomposing at high temperature, (2) and to perform as reductive circumstance. $N_2$ or the mixture of $N_2$ and $H_2$ is commonly introduced as inert gas, under high atmospheric pressure or room pressure. Before high-temperature roasting, during mixed and grinding step, solvent Ethanol or n-Hexane can be used for mixed more evenly. Also, before high-temperature roasting, halide of fluxing agent M, or of Al, or boric acid can be adopted. And during post-treatment reactive impurities can be removed. On the basis of above mentioned materials, after high-temperature roasting, normally are oxides which containing element M, and/or Al, and/or Si. All these impurities, besides part of which volatilized, by using acid pickling or rinsing by water step, can be removed.

The luminescent material synthesized by the method of the present invention can be excited by ultraviolet, near ultraviolet or blue excitation light source such as LED, then emits red light with wavelength between 500-800nm, especially the maximum emission wavelength between 600-700 nm, in light of which the luminescent material, with other luminescent materials, such as green luminescent material, can be coated at blue LED chip to create new type of white LED. And also with other luminescent materials, such as blue or green luminescent material, coated at ultraviolet or near ultraviolet LED chip to create new type of white LED, and the efficiency of energy transformation is high. And with blue LED, ultraviolet or near ultraviolet LED, or mixed with other luminescent materials to create the colorful LED.

The present preparation procedure is simple and handled easily, easy to mass production, and by partially replacing elements, wavelength tunable and improved luminous intensity achieved. And the present method of the preparation for the luminescence material is simple, handled easily, easy to mass production, pollution-free and with low costs.

Characterized in as following:
(1) The luminescence material synthetized by using the presented method is a Nitrogen compound with stable performance and good temperature characteristics.
(2) With broader excitation spectrum range between 200-500 nm, the luminescence material shows a better activating effect.
(3) And the present method of the preparation for the luminescence material is simple and practical, pollution-free, easy to mass production, and handled easily.
(4) The white LED by using the present method has high color rendering index, high luminous efficiency, and wide color temperature range.

THE DETAILED METHOD AND BASIC PROCESSES

The detailed method and basic processes will be further elaborated by embodiments as following.

TABLE 1

The material components and luminescent properties of the embodiments

|  | Components | Emission Wavelength | Luminous Intensity |
| --- | --- | --- | --- |
| Embodiment 1 | $Ca_{0.99}AlSiC_{0.02}N_{2.9733}:Eu_{0.01}$ | 653 | 111 |
| Embodiment 2 | $Ca_{0.99}AlSiC_{0.05}N_{2.9333}:Eu_{0.01}$ | 654 | 105 |
| Embodiment 3 | $Ca_{0.99}AlSiC_{0.1}N_{2.8667}:Eu_{0.01}$ | 655 | 98 |
| Embodiment 4 | $Ca_{0.98}Sr_{0.01}AlSiC_{0.01}N_{2.9867}:Eu_{0.01}$ | 646 | 120 |
| Embodiment 5 | $Ca_{0.89}Sr_{0.1}AlSiC_{0.01}N_{2.9867}:Eu_{0.01}$ | 642 | 132 |
| Embodiment 6 | $Ca_{0.49}Sr_{0.5}AlSiC_{0.01}N_{2.9867}:Eu_{0.01}$ | 630 | 145 |
| Embodiment 7 | $Ca_{0.19}Sr_{0.8}AlSiC_{0.01}N_{2.9867}:Eu_{0.01}$ | 625 | 161 |
| Embodiment 8 | $Ca_{0.98}Ba_{0.01}AlSiC_{0.01}N_{2.9867}:Eu_{0.01}$ | 650 | 103 |
| Embodiment 9 | $Ca_{0.89}Ba_{0.1}AlSiC_{0.01}N_{2.9867}:Eu_{0.01}$ | 644 | 118 |
| Embodiment 10 | $Ca_{0.94}Li_{0.1}AlSiC_{0.02}N_{2.9733}:Eu_{0.01}$ | 646 | 124 |
| Embodiment 11 | $Ca_{0.84}Li_{0.1}Sr_{0.1}AlSiC_{0.02}N_{2.9733}:Eu_{0.01}$ | 642 | 134 |
| Embodiment 12 | $Ca_{0.98}Mg_{0.01}AlSiC_{0.01}N_{2.9867}:Eu_{0.01}$ | 647 | 99 |

Embodiment 1 $Ca_{0.99}AlSiC_{0.02}N_{2.9733}$:$Eu_{0.01}$

The raw materials introduced in embodiment 1 are $Ca_3N_2$, $Si_3N_4$, AlN, EuN and high purity carbon powder. Mixed 100 g of raw materials shown below with 0.5 wt % of fluxing agent $CaF_2$.

$Ca_3N_2$ 35.3246 g
$Si_3N_4$ 33.7048 g
AlN 29.59898 g
EuN 1.1984 g
C 0.1733 g

Put the powder materials into an agate mortar, and then after mixed and grinding evenly in the glove box (the oxygen content lower than 1 ppm, and the moisture content lower than 1 ppm). The mixed powder loosely respectively loaded into the crucible which is made of Molybdenum, and then removed from the glove box and placed in the high-temperature tube furnace. The tube furnace via vacuum and filled with nitrogen, then start heating with the heating rate is 10° C./min and nitrogen pressure is of 1 atm. After the temperature was raised to 1600° C. incubating for 6 hours, then turn off the power after the end of the incubation period, cooling in furnace. The calcined sample was removed out, via crushing, grinding and acid pickling, then measured fluorescence spectrum and shot the photos of the granule property.

Figure 1:
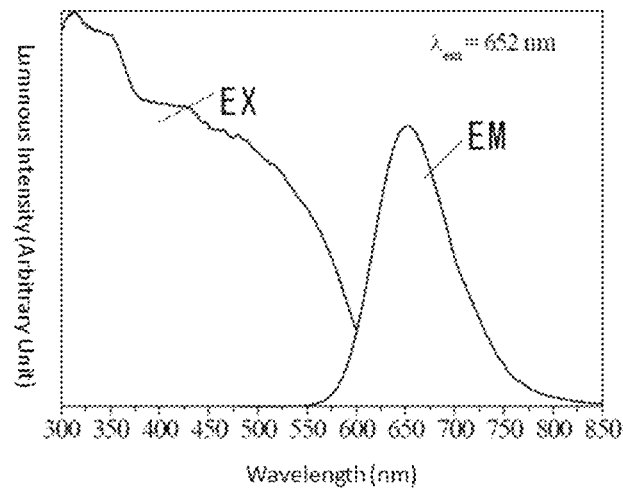
FIG. 1 shows emission spectrum and excitation spectrum of embodiment 1, ordinates in the figure show luminous intensity, and horizontal coordinates show the wavelength of light.

FIG. 1 shows the emission spectrum of the embodiment 1. The excitation spectrum (EX) illustrates very clearly that the material can be excited by blue and ultraviolet light. The emission spectrum (EM) is a wide spectrum, covering the range from 550 to 800 nm, with the full width at half maximum (FWHM) is 90 nm, and mission peak at 652 nm. The wide emission spectrum shows which belongs to 5d-4f electron transition of activated $Eu^{2+}$, not to 4f-4f electron transition of activated $Eu^{3+}$. In light of adopted raw material Eu (EuN), we believe that under conditions of carbon atmosphere $Eu^{3+}$ in the raw material was reduced into $Eu^{2+}$. We can see from the emission spectrum of the material in embodiment 1, that the material emits red light, and is capable of absorbing blue or ultraviolet light, on basis of which is a red fluorescent powder, and can be applied to the white LED.

Figure 2:
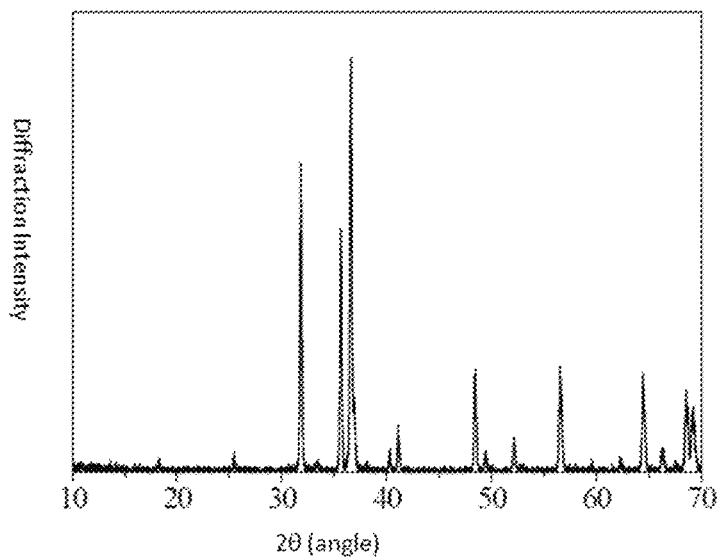
FIG. 2 shows X-Ray Diffraction (XRD) spectrum of embodiment 1.

FIG. 2 shows X-Ray Diffraction (XRD) spectrum of embodiment 1. And we can determine from the map that the materials in embodiment 1 match with JCPDS card No. 39-0747 having the same crystal structure as $CaAlSiN_3$.

Figure 3:
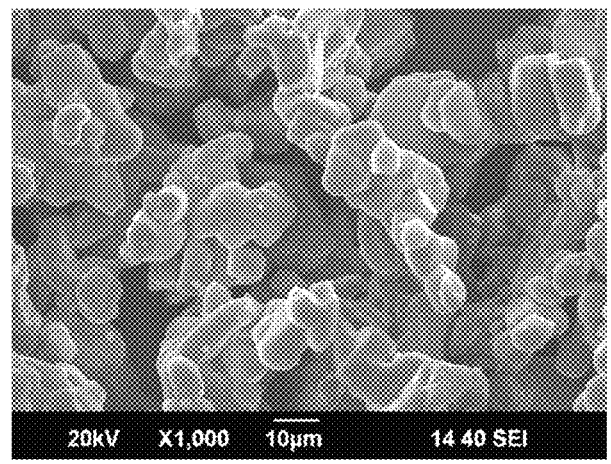
FIG. 3 shows SEM photographs of embodiment 1.

FIG. 3 shows SEM photographs of the materials in embodiment 1. The crystalline particles with relatively good crystallinity, smooth particle surface, relatively uniform size, and the average particle size of about 12 μm, has the slight agglomeration.

Embodiment 7 $Ca_{0.19}Sr_{0.8}AlSiC_{0.01}N_{2.9867}$: $Eu_{0.01}$

The raw materials introduced in embodiment 7 are $Ca_3N_2$, $Si_3N_4$, AlN, EuN and SiC. Mixed 100 g of raw materials shown below with 0.2 wt % of fluxing agent $SrF_2$.

$Ca_3N_2$ 5.1761 g
$Si_3N_2$ 42.9300 g
$Si_3N_4$ 25.7337 g
AlN 22.5989 g
EuN 0.9150 g
SiC 2.6464 g

Put the powder materials into an agate mortar, and then after mixed and grinding evenly in the glove box (the oxygen content lower than 1 ppm, and the moisture content lower than 1 ppm). The mixed powder loosely respectively loaded into the crucible which is made of Boron Nitride, and then removed from the glove box and placed in the high-temperature graphite furnace. The graphite furnace via vacuum ($10^{-3}$ torr) and filled with nitrogen, then start heating with the heating rate is 10° C. /min and nitrogen pressure is of 10 atm. After the temperature was raised to 1800° C. incubating for 6 hours, then turn off the power after the end of the incubation period, cooling in furnace. The calcined sample was removed out, via crushing, grinding and acid pickling, then measured fluorescence spectrum and shot the photos of the granule property.

Figure 4:
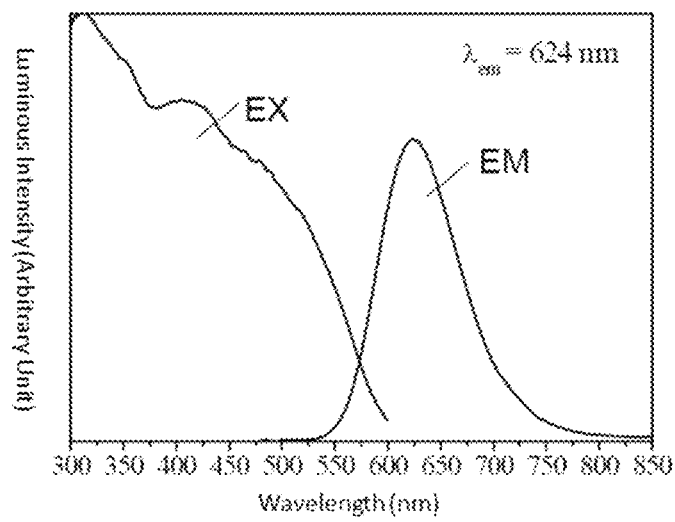
FIG. 4 shows emission spectrum and excitation spectrum of embodiment 7, ordinates in the figure show luminous intensity, and horizontal coordinates show the wavelength of light.

FIG. 4 shows the emission spectrum of the embodiment 7. Just like in embodiment 1, the excitation spectrum (EX) of the embodiment 7 is also a wide spectrum, which illustrates that the luminescent material can be excited by blue and ultraviolet light. The emission spectrum (EM) is a wide spectrum, covering the range from 550 to 850 nm, with the full width at half maximum (FWHM) is 88 nm, and mission peak at 624 nm. The wide emission spectrum shows which belongs to 5d-4f electron transition of activated $Eu^{2+}$, not to 4f-4f electron transition of activated $Eu^{3+}$. In contrast with embodiment 1, a blue-shift of the emission wavelength in embodiment 7 that the emission spectrum moving to the short wavelength was observed, which because of partial substitution of Ca by Si leading to lattice volume increased and thus the crystal field splitting degree decreased, and which improved the 5d orbital energy level of $Eu^{2+}$ and shortened the emission wavelength. Embodiment 7 has the same X-Ray Diffraction (XRD) spectrum as Embodiment 1, which proved that embodiment 7 has the same crystal structure as $CaAlSiN_3$. We can see from the emission spectrum of the material in embodiment 7, that the material emits red light, and is capable of absorbing blue or ultraviolet light, and is a red fluorescent powder which can be applied to the white LED.

Figure 5:
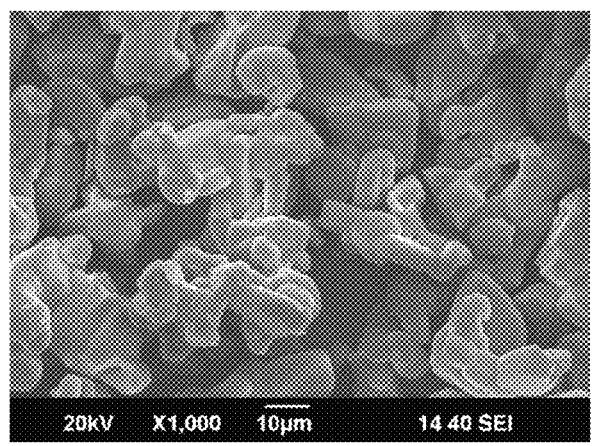
FIG. 5 shows SEM photographs of embodiment 7.

FIG. 5 shows SEM photographs of the materials in embodiment 7. The crystalline particles with relatively good crystallinity, smooth particle surface, relatively uniform size, and the average particle size of about 16 μm, has the slight agglomeration.

Embodiment 11 $Ca_{0.84}Li_{0.1}Sr_{0.1}AlSiC_{0.02}N_{2.9733}$: $Eu_{0.01}$

The raw materials introduced in embodiment 11 are $Ca_3N_2$, $Si_3N_4$, AlN, EuN, $Li_3N$ and high purity carbon powder. Mixed 100 g of raw materials shown below with 0.5 wt % of fluxing agent $NH_4F$.

$Ca_3N_2$ 29.2360 g
$Si_3N_2$ 6.8558 g
$Li_3N$ 0.8218 g
$Si_3N_4$ 32.8767 g
AlN 28.8717 g
EuN 1.1690 g
C 0.1690 g

Put the powder materials into an agate mortar, and then after mixed and grinding evenly in the glove box (the oxygen content lower than 1 ppm, and the moisture content lower than 1 ppm). The mixed powder loosely respectively loaded into the crucible which is made of Boron Nitride, and then removed from the glove box and placed in the high-temperature graphite furnace. The graphite furnace via vacuum ($10^{-3}$ torr) and filled with nitrogen, then start heating with the heating rate is 10° C./min and nitrogen pressure is of 1 atm. After the temperature was raised to 1600° C. incubating for 8 hours, then turn off the power after the end of the incubation period, cooling in furnace. The calcined sample was removed out, via crushing, grinding and acid pickling, then measured fluorescence spectrum and shot the photos of the granule property.

Figure 6:
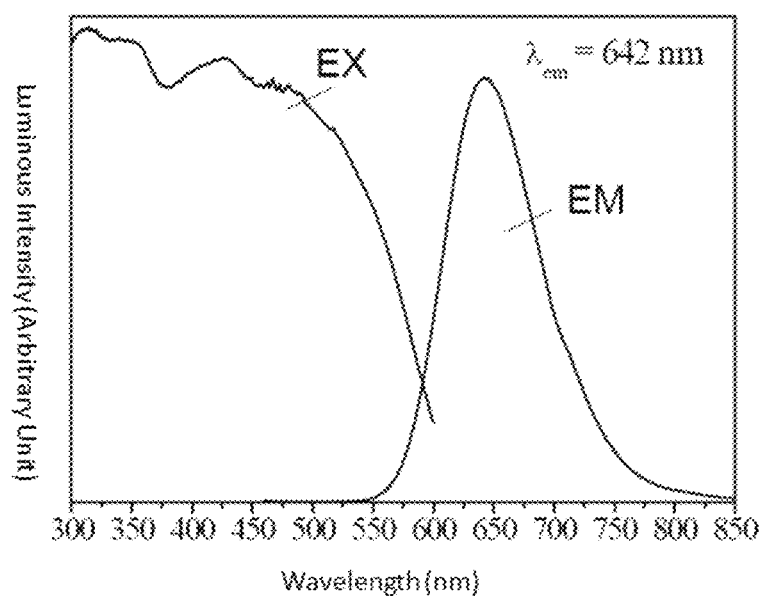
FIG. 6 shows emission spectrum and excitation spectrum of embodiment 11, ordinates in the figure show luminous intensity, and horizontal coordinates show the wavelength of light.

FIG. 6 shows the emission spectrum of the embodiment 11. Just like in embodiment 1, the excitation spectrum (EX) of the embodiment 11 is also a wide spectrum, which illustrates that the luminescent material can be excited by blue and ultraviolet light. And in contrast with the excitation spectrum in embodiment 1 and embodiment 7, the absorption of blue light had been strengthened. The emission spectrum (EM) is a wide spectrum, covering the range from 550 to 850 nm, with the full width at half maximum (FWHM) is 92 nm, and mission peak at 624 nm. The wide emission spectrum shows which belongs to 5d-4f electron transition of activated $Eu^{2+}$, not to 4f-4f electron transition of activated $Eu^{3+}$. In contrast with embodiment 1, a blue-shift of the emission wavelength in embodiment 11, that the emission spectrum moving to the short wavelength was observed. Embodiment 7 has the same X-Ray Diffraction (XRD) spectrum as Embodiment 1, which proved that embodiment 11 has the same crystal structure as $CaAlSiN_3$. We can see from the emission spectrum of the material in embodiment 7, that the material emits red light, and is capable of absorbing blue or ultraviolet light, and is a red fluorescent powder which can be applied to the white LED.

Figure 7:
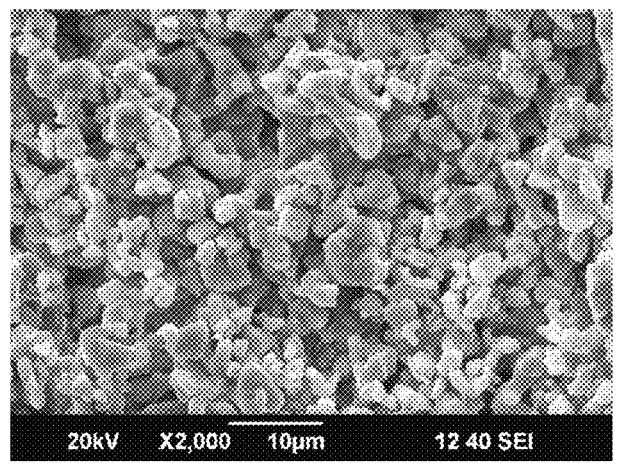
FIG. 7 shows SEM photographs of embodiment 11.

FIG. 7 shows SEM photographs of the materials in embodiment 11. The crystalline particles with relatively good crystallinity, smooth particle surface, relatively uniform size, and the average particle size of about 6 μm, has good dispersion.

The synthesis of materials in other embodiments adopted the methods described in embodiments 1,7,11, but not limited to these methods.

Embodiment 13 the Preparation of High Color Rendering White LED Light Source

Figure 8:
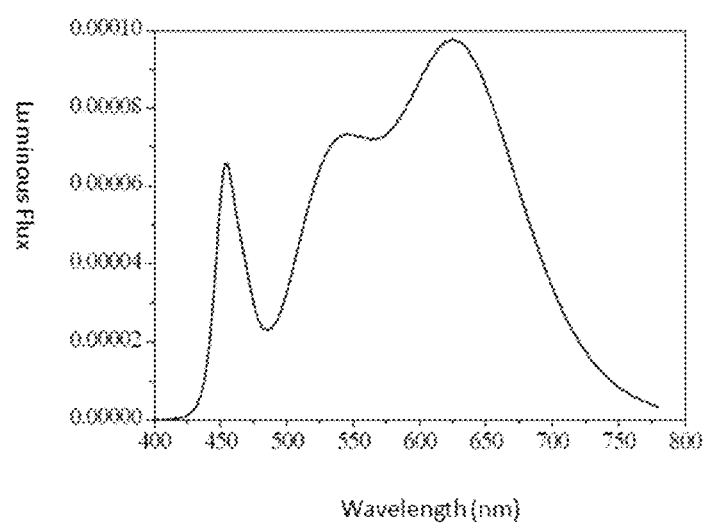
FIG. 8 shows emission spectrum of the white LED illumination source prepared in embodiment 11.

Weighed a certain amount of red fluorescent powder $(Ca_{0.84}Li_{0.1}Sr_{0.1}AlSiC_{0.02}N_{2.9733}: Eu_{0.01})$, green fluorescent powder Silicate $(Sr, Ba)_2 SiO_4: Eu^{2+}$ and yellow fluorescent powder Yttrium Aluminum Garnet YAG: $Ce^{3+}$ produced according to embodiment 11, and uniformly dispersed in the epoxy resin, then after mixed and de-aeration step, the compound reached was coated on a commercially available blue LED chip, and the emission wavelength of the blue LED is 453 nm. Eventually, after drying for 0.5 hour at 150° C., encapsulation step finished. Blue light emitted by blue LED mixed with red, yellow and green light emitted by fluorescent powder, produced warm white light with coordinates as following: x=0.4192, y=0.4036, and with color rendering index: Ra=94, and with color temperature: T=3300K. FIG. 8 shows the emission spectrum of white LED which produced by red fluorescent powder in embodiment 13, and the corresponding optical parameters see table.2.

TABLE 2 the optical parameters of white LED in the embodiments

| Embodiment | White LED | Color Coordinates (x, y) | Color Rendering Index/Ra | Color Temperature/K | Luminous Efficiency/ lm/W |
|---|---|---|---|---|---|
| Embodiment | Blue LED + Embodiment 11 + green fluorescent powder (Sr, Ba)$_2$SiO$_4$ + yellow fluorescent powder YAG: Ce$^{3+}$ | (0.4192, 0.4036) | 94 | 3300 | 81 |

According to the method described in embodiment 13, and the general knowledge on the preparation of white LED, by mixing different proportions of the present invention described red fluorescent powder and other green fluorescent powders(such as $SrSi_2O_2N_2:Eu^{2+}$, β-sialon:$Eu^{2+}$, $Lu_3Al_5O_{12}: Ce^{3+}$ and not limited to the listed fluorescent powders), and yellow fluorescent powder(such as YAG:$Ce^{3+}$, α-sialon: $Eu^{2+}$, $La_3Si_6N_{11}: Ce^{3+}$, $(Sr, Ba)Si_2O_2N_2:Eu^{2+}$, and not limited to the listed fluorescent powders), and with the blue LED chip the white LED light source can be prepared.

The invention claimed is:

1. A nitrogen compound luminescence material, with chemical formula: $M_{1-y}Eu_yAlSiC_xN_{3-4/3x}$, wherein:
   M represents an alkali metal;
   $0<x\leq0.2$, $0<y\leq0.5$ and
   C represents the element carbon.

2. The material of claim 1, wherein:
   the alkali metal comprises one or more of Li, Mg, Ca, Sr and Ba.

3. The material of claim 2, wherein:
   M represents Ca mixed with other elements.

4. The material of claim 3, wherein:
   M represents Ca mixed with Si or Li.

5. The material of claim 1, wherein:
   $0.01\leq x\leq 0.1$, and
   $0.01\leq y\leq 0.1$.

6. A method of preparing the nitrogen compound of claim 1, comprising:
   (1) by milling, obtaining a mixture by mixing elemental M or M-containing Oxides, Nitrides, Nitrates, Carbonates or Halide, with Eu-containing Nitrides, Nitrates, Oxides or Halide, and with Al-containing Nitrides, Oxides, Nitrates, Carbonates or Halide, and elemental Si and Si-containing Nitrides, Oxides or Nitrides, and elemental C or compound C;
   (2) under inert gas protection heating the mixture using gas pressure sintering or a solid reaction process, to obtain a product; and
   (3) applying to the reacted product a process including grinding, impurity removal, heating and sizing, to obtain the nitrogen compound luminescence material.

7. The method according to claim 6, wherein:
   the inert gas in the gas pressure sintering step includes nitrogen, with the pressure between 1-200 atmospheres; and
   the inert gas in the solid reaction process includes nitrogen at substantially standard pressure, with a gas flow rate between 0.1-3 L/min.

8. The method according to claim 6, wherein:
   heating the mixture is performed in an environment having a temperature between 1200-1900° C. and for a cumulative duration of 0.5-30 hours.

9. The method according to claim 6, further comprising:
   adding to the mixture a reaction flux that includes one or more of M containing halide, Al-containing halide and Boric acid.

10. The method according to claim 9, wherein:
    the amount of the reaction flux is 0.01-10% of the total amount of the other materials in the mixture.

11. The method according to claim 6, wherein:
    the impurity removal includes acid pickling or rinsing by water.

12. The method according to claim 6, wherein:
the alkali metal comprises one or more of Li, Mg, Ca, Sr and Ba.

13. The method according to claim 6, wherein:
M represents Ca mixed with other elements.

14. The method according to claim 6, wherein:
M represents Ca mixed with Si or Li.

15. The method according to claim 6, wherein:
$0.01 \leq x \leq 0.1$, and
$0.01 \leq y \leq 0.1$.

16. A white LED light source comprising:
a blue LED;
a green luminescence material; and
a red luminescence material having the nitrogen compound luminescence material according to claim 1.

17. The white LED according to claim 16, wherein:
the alkali metal comprises one or more of Li, Mg, Ca, Sr and Ba.

18. The white LED according to claim 16, wherein:
M represents Ca mixed with other elements.

19. The white LED according to claim 16 wherein:
M represents Ca mixed with Si or Li.

20. The white LED according to claim 16, wherein:
$0.01 \leq x \leq 0.1$, and
$0.01 \leq y \leq 0.1$.

* * * * *